United States Patent [19]

Leonard

[11] 4,451,731

[45] May 29, 1984

[54] APPARATUS AND METHOD FOR MODULATING LIGHT TO GENERATE AN INDEX PULSE

[75] Inventor: Mark Leonard, Los Altos, Calif.

[73] Assignee: Hewlett-Packard Company, Palo Alto, Calif.

[21] Appl. No.: 291,666

[22] Filed: Aug. 10, 1981

[51] Int. Cl.³ .............................................. G01D 5/38
[52] U.S. Cl. .......................... 250/237 SE; 250/237 G
[58] Field of Search ........ 250/231 SE, 237 G, 231 R, 250/237 R; 340/347 P; 324/175; 356/395

[56] References Cited

U.S. PATENT DOCUMENTS 3,187,187 6/1965 Wingate .......................... 250/231 SE
4,266,125 5/1981 Epstein et al. .............. 250/237 G X

FOREIGN PATENT DOCUMENTS 1203787 9/1970 United Kingdom .
2067282A 7/1981 United Kingdom .

Primary Examiner—David C. Nelms
Assistant Examiner—Edward P. Westin
Attorney, Agent, or Firm—Douglas A. Kundrat

[57] ABSTRACT

An apparatus and method are provided to obtain a sharp index pulse with minium side lobes for an optical shaft encoder. By nonuniformly aligned multiple transmissive sections in the encoder wheel and phase plate of the shaft encoder, the transmissive sections become nonprogressively coincident in the light modulation process to provide the desired index pulse. In another preferred embodiment, secondary tracks having nonuniformly positioned multiple transmissive sections provide a parallel modulated light to enhance the index pulse and further reduce side lobes.

9 Claims, 20 Drawing Figures

PRIOR ART

PRIOR ART

TRACK A
FIGURE 4A
TRACK B
FIGURE 4B
FIGURE 4C
FIGURE 4D
TRACK A
FIGURE 5A
TRACK B
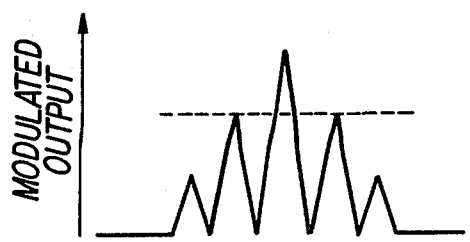
FIGURE 5B
FIGURE 5C

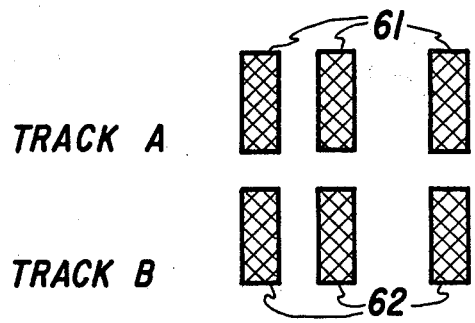
FIGURE 6A
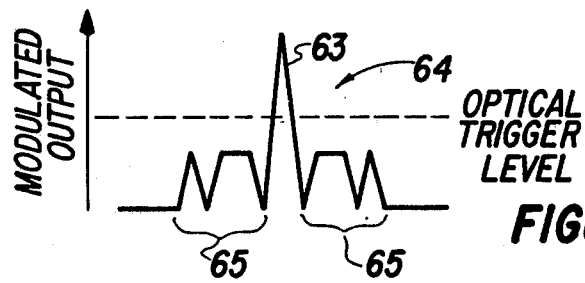
FIGURE 6B
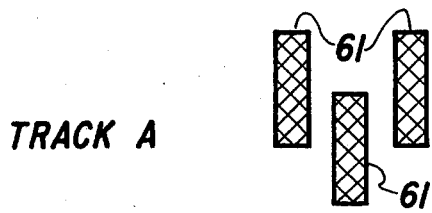
FIGURE 7A
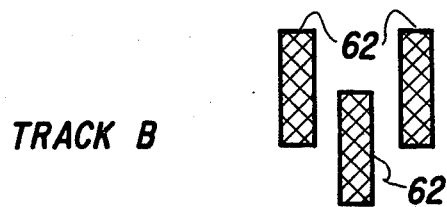
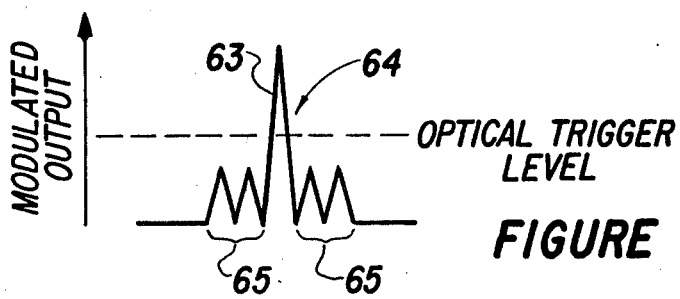
FIGURE 7B

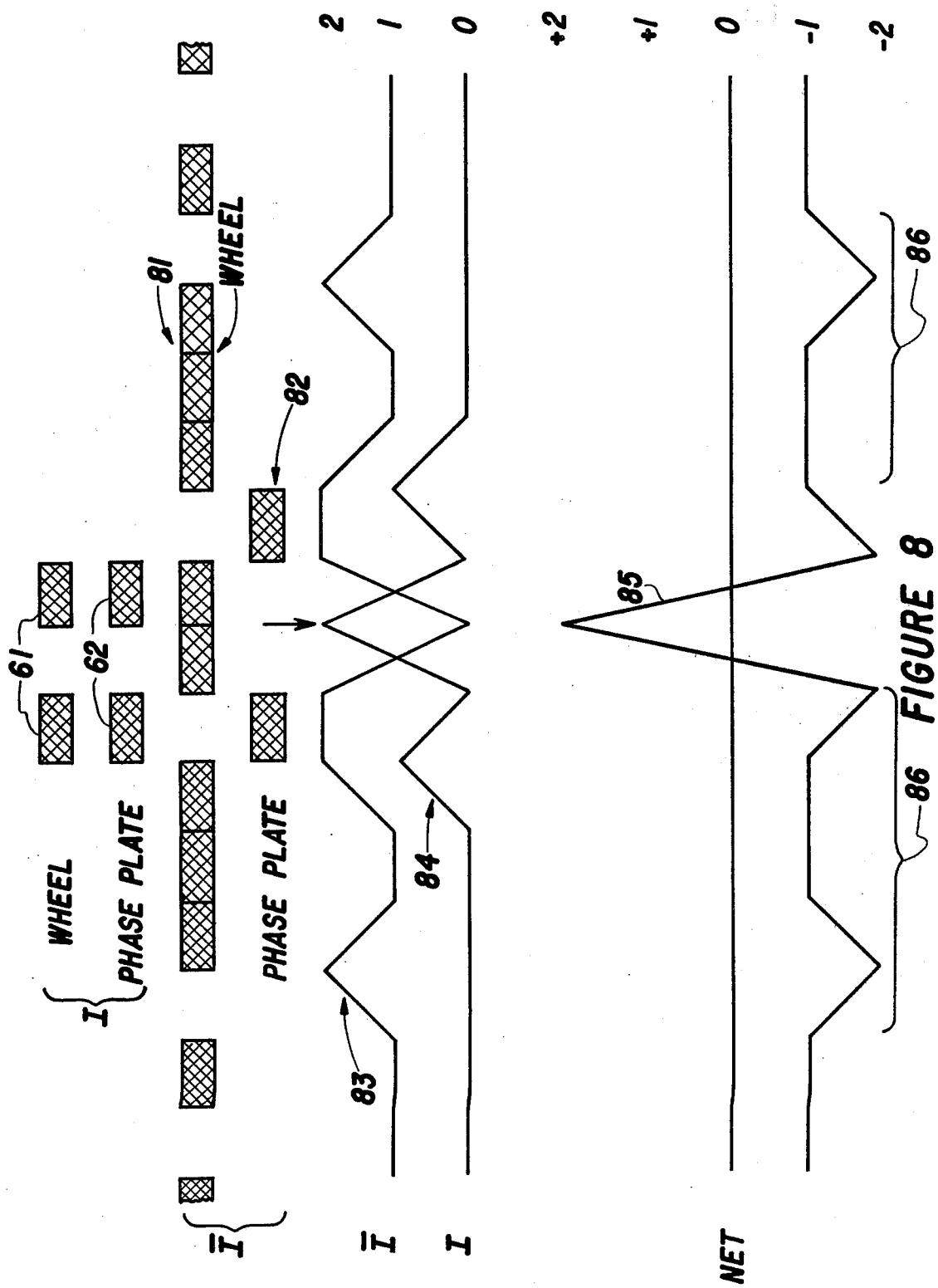

APPARATUS AND METHOD FOR MODULATING LIGHT TO GENERATE AN INDEX PULSE

BACKGROUND AND SUMMARY OF THE INVENTION

In optical shaft encoders, such as that described in U.S. Pat. No. 4,266,125, herein incorporated by reference, an index pulse is desired to provide synchronization of the encoder wheel to the optical shaft encoder. As an example, an index pulse in the above referenced prior art is obtained as illustrated in FIG. 1. As illustrated in FIGS. 2A, 2B, a push-pull system using two tracks 140, 150 on an encoder wheel in concert with two substantially equal slits 200, 210 on a phase plate modulates two beams of light serially to provide signals I and $\bar{I}$. These signals I and $\bar{I}$, shown in FIG. 3B, are compared by an optical comparator and an index pulse, shown in FIG. 3A, is generated in response to signals I and $\bar{I}$ attaining equal amplitudes. In this example, one track 140 on the encoder wheel is characterized by an opaque section surrounded by two clear sections having arc dimensions equal to or greater than the arc dimension of the opaque section, which is substantially equal to that of the slits 200, 210 on the phase plate.

The above example, typical of the prior art, uses a single radial slit to generate signal I or $\bar{I}$ for obtaining an index pulse. A single slit has the characteristic that the width of the output pulse is equal to the radial width of that slit. For high resolution, the slit is ideally narrow. A narrow slit, however, has the disadvantage of having a small area, which in turn makes it difficult to get enough light through the slit for detection.

One way to overcome this disadvantage is to use multiple sections, or slits in the prior example, to generate a large area for light transmission. Multiple sections, without more, do overcome the light problem, but they in turn introduce another problem: uncertain triggering. In the simplest system of indexing, an index pulse is generated by using a section on a phase plate to modulate light transmitted by a section on an encoder wheel as they pass each other. The generated waveform for such a system is shown in FIG. 4C. This waveform is detected by an optical comparator to provide, at some level, a pulse as shown in FIG. 4D. By having merely multiple sections as shown in FIG. 5A, the waveform in FIG. 5B results. As one track passes the other, the multiple sections on one track progressively become coincident with those on the other to give rise to side lobes. These side lobes are readily seen in FIG. 5B. Because of these side lobes, it is possible to have false triggering should either the amplitude vary, such as from variations in the light source, or the sensitivity of the optical detector vary. This is exemplified by comparator outputs A and B in FIG. 5C.

The preferred embodiment in accordance with the invention does not have these disadvantages. It allows sufficient transmission of light by having multiple transmission sections in the tracks. However, these sections are nonuniformly positioned on the encoder wheel and phase plate so that when the transmissive sections become coincident, they do so nonprogressively. In other words, by judiciously positioning the transmissive sections in a nonuniform manner, the side lobes in a multiple-sectioned transmission are greatly reduced to provide a substantially isolated index pulse.

BRIEF DESCRIPTION OF THE DRAWINGS

FIG. 4C shows the waveform generated by transmissive sections on track A (encoder wheel), illustrated by FIG. 4A, and track B (phase plate), illustrated by FIG. 4B, passing by one another. FIG. 4D shows an index pulse derived from the waveform of FIG. 4C at an optical trigger level.

FIG. 5B shows the waveform generated by multiple transmissive sections uniformly spaced on tracks A and B of an encoder wheel and phase plate, respectively, passing by one another. FIG. 5A shows these tracks. FIG. 5C shows the results on uncertain triggering.

FIG. 6A shows a pattern for light modulation in accordance with the invention. FIG. 6B shows the resultant optical waveform using the modulating pattern of 6A for modulation.

FIG. 7A shows another pattern in accordance with the invention. FIG. 7B shows its resultant waveform.

FIG. 8 shows an index pulse derived from a preferred embodiment of the invention in which nonuniformly spaced transmissive sections are utilized.

DETAILED DESCRIPTION OF THE PREFERRED EMBODIMENT

In a preferred embodiment in accordance with the invention as illustrated in FIG. 6A, multiple transmissive sections 61 of an encoder wheel are patterned nonuniformly such that nonuniform spacing is achieved so that when corresponding multiple transmissive sections 62 of a phase plate modulate the transmitted light, a nonprogressive pulse 63 is obtained. The resultant waveform 64 from such a placement of transmissive sections is shown in FIG. 6B. Still another example of nonuniform placement of transmissive sections 61, 62 in which nonuniform alignment is achieved is shown in FIG. 7A; the resultant waveform 64 is shown in FIG. 7B. The transmissive sections 61, 62 may comprise, e.g., slits through the encoder wheel and the phase plate.

Figure 1:
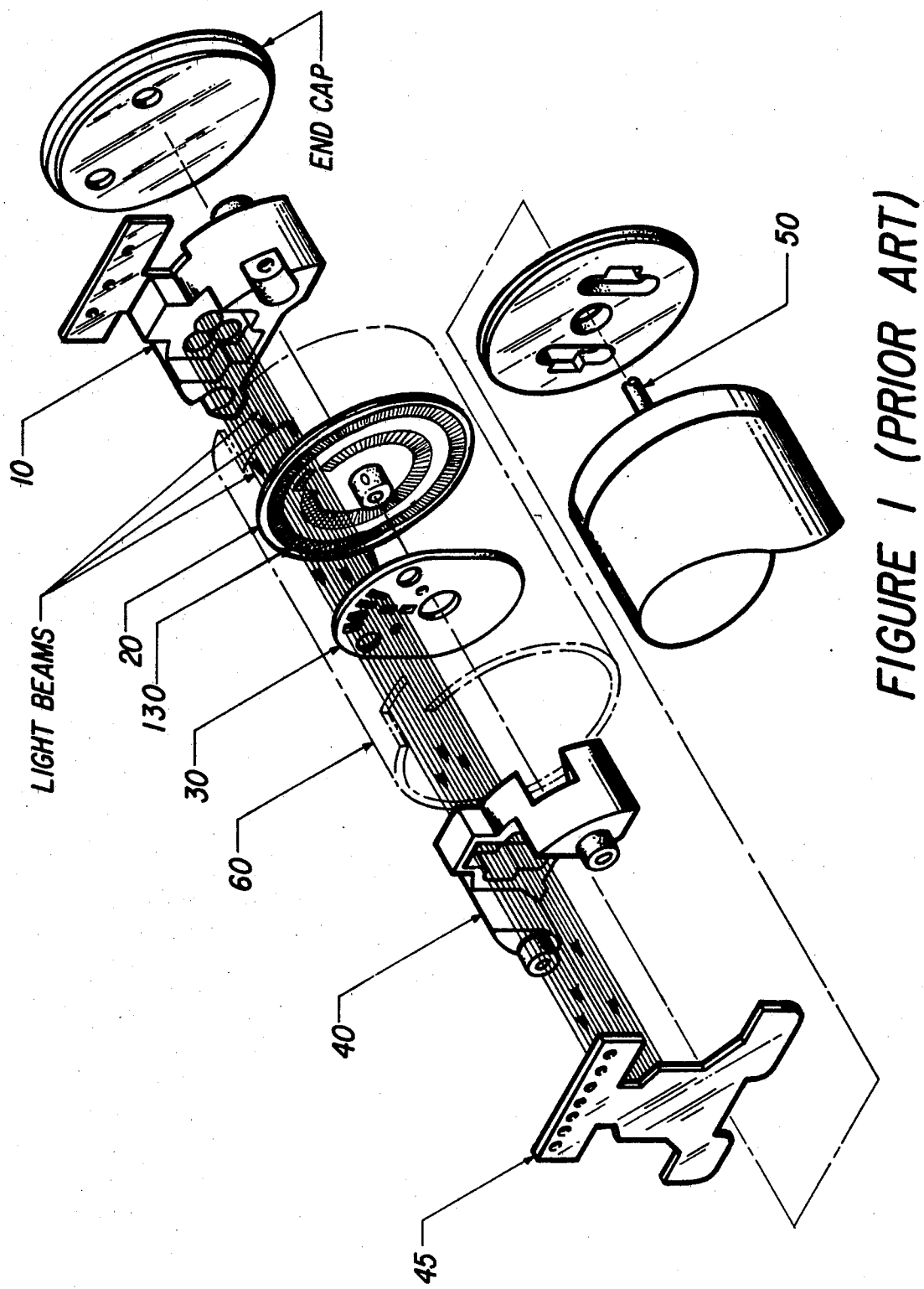
FIG. 1 shows an optical shaft encoder in the prior art having an index pulse generator.
Figure 2A:
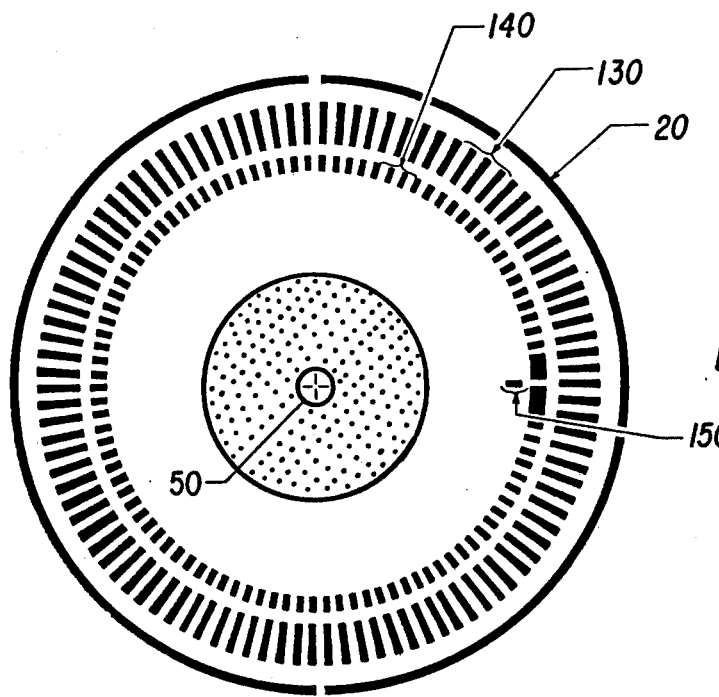
FIG. 2A shows an encoder wheel.
Figure 2B:
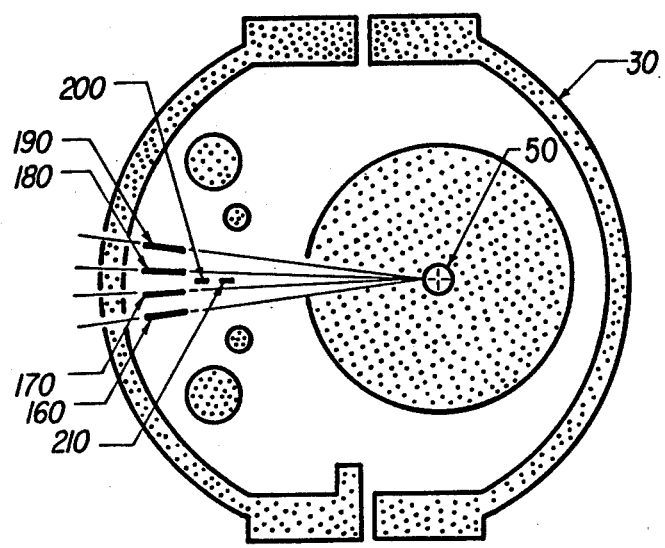
FIG. 2B shows transmissive sections on a phase plate for modulating the light being transmitted by the encoder wheel of FIG. 2A to generate an index pulse.
Figure 3A:
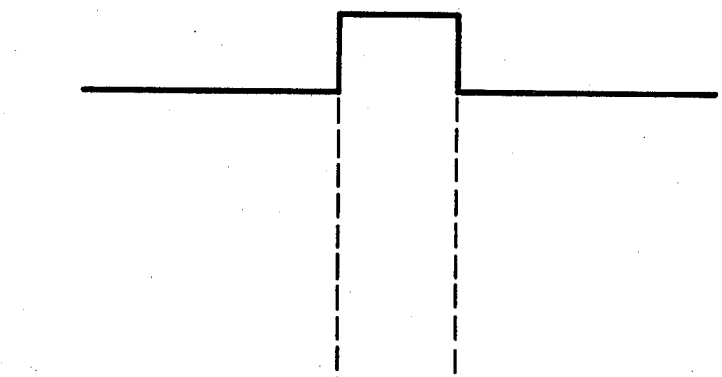
FIG. 3A shows an index pulse waveform.
Figure 3B:
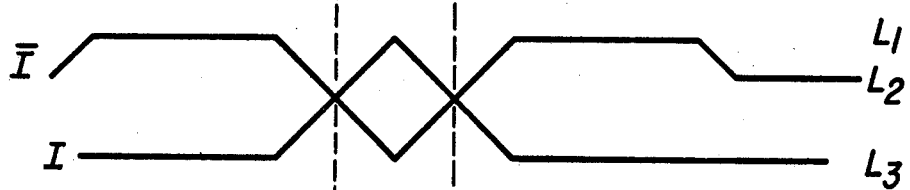
FIG. 3B shows time signals I and $\bar{I}$ used in the prior art example of FIG. 1 for generating the index pulse of FIG. 3A.
Figure 3C:
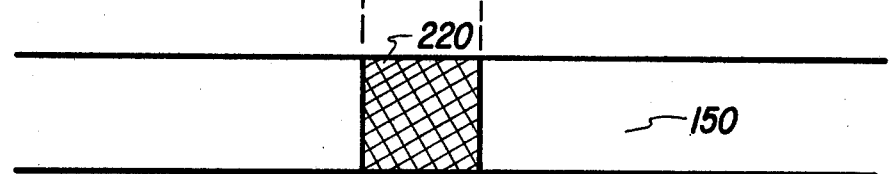
FIGS. 3C and 3D show the two encoder wheel tracks used in the prior art example of FIG. 1 for generating the waveforms shown in FIGS. 3A and 3B. Transparent areas are illustrated by shading and opaque areas are illustrated in white.
Figure 3D:
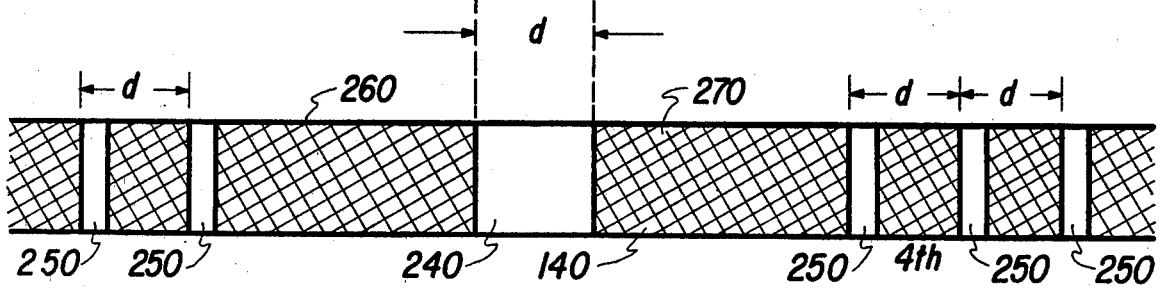
Figure 9:
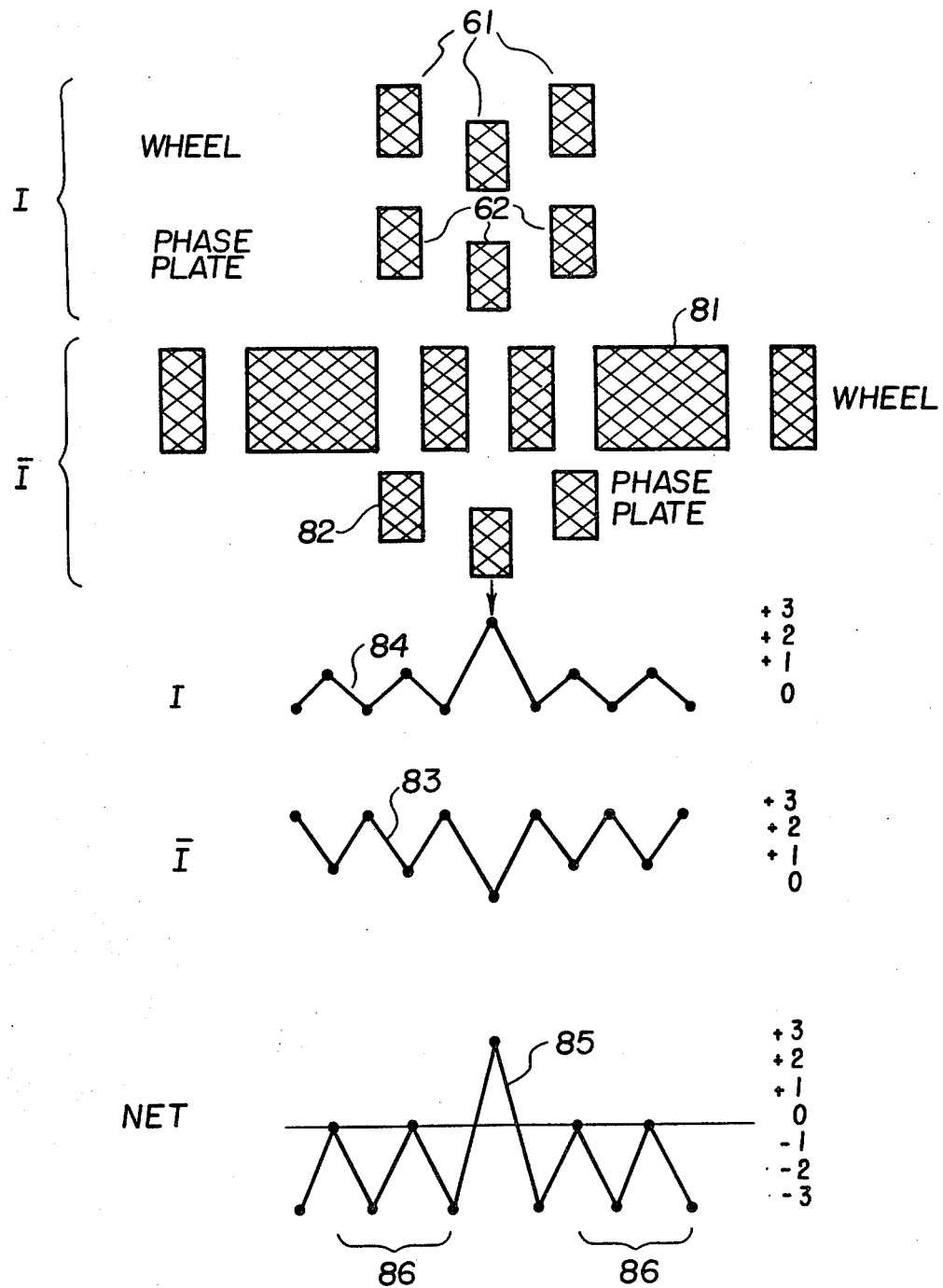
FIG. 9 shows an index pulse which is derived from a preferred embodiment of the present invention in which nonuniformly aligned transmissive sections are utilized.

To further reduce the side lobes 65 inherent in multiple section transmission, a secondary transmission can be used. In accordance with this embodiment, illustrated in FIG. 8 (utilizing the embodiment shown in FIG. 6A) and in FIG. 9 (utilizing the embodiment shown in FIG. 7A), a second multiple transmission track 81, 82 (which may comprise, e.g., slits through the encoder wheel and the phase plate) is patterned parallel to the first in both the encoder wheel and phase plates. The transmissive sections to these secondary tracks 81, 82, however, are patterned so that the encoder wheel and phase plate are substantially nontransmitting at these secondary tracks when the transmissive sections 61, 62 at the primary tracks are substantially coincident. In this way, the transmission output 83 from the secondary tracks can be compared with the output 84 from the primary tracks to obtain an index pulse 85 and to lower the side lobes 86. This comparison can take the form of a push-pull detector or a differential detector. Thus, by nonuniformly positioning the transmissive sections to become coincident nonprogressively, a clear and sharp index pulse 85 is obtained.

I claim:

1. An apparatus for modulating light comprising:
   a first track having a first select pattern of alternating non-transmissive and nonuniformly aligned transmissive sections for modulating light;
   a second track having a second select pattern of alternating and non-transmissive and nonuniformly aligned transmissive sections for modulating light transmitted by said first track, said second select pattern nonprogressively becoming substantially coincident with a portion of said first select pattern when said tracks move past each other; and
   means for causing said tracks to move past each other.

2. The apparatus as in claim 1, wherein said first track forms a circular track on an encoder wheel and said second track forms a circular track on a phase plate to an optical shaft encoder.

3. The apparatus as in claim 1, further comprising:
   a third track having a plurality of alternating transmissive and non-transmissive sections of a third select pattern fixedly paralleling said first track for modulating light; and
   a fourth track having a plurality of alternating transmissive and non-transmissive sections of a fourth select pattern fixedly paralleling said second track for modulating light transmitted by said third track, said third and fourth select patterns being substantially noncoincident when said first and second select patterns are substantially coincident.

4. The apparatus as in claim 3, wherein the transmissive sections of the first, second, third, and fourth tracks comprise a plurality of slits.

5. The apparatus as in claim 3, wherein the transmissive sections of the third and fourth tracks comprise a plurality of nonuniformly aligned slits.

6. The apparatus as in claim 3, 4, or 5, wherein said first and third tracks form circular tracks on an encoder wheel and said second and fourth tracks form circular tracks on a phase plate to an optical shaft encoder.

7. A method of reducing transmission side lobes when modulating light comprising the steps of:
   aligning nonuniformly a first plurality of transmissive sections in a first modulating means for modulating light;
   aligning nonuniformly a second plurality of transmissive sections in a second modulating means for modulating light transmitted by said first modulating means;
   patterning said second plurality to nonprogressively be substantially coincident with a portion of said first plurality when said first and second modulating means move past each other; and
   moving said first and second modulating means past each other to serially modulate light.

8. The method as in claim 7 further comprising the steps of:
   patterning in said first modulating means a third plurality of transmissive sections fixedly parallel to said first plurality of transmissive sections;
   patterning in said second modulating means a fourth plurality of transmissive sections for modulating light transmitted by said third plurality, said fourth plurality being fixedly parallel to said second plurality;
   further patterning said third and fourth pluralities to be substantially noncoincident when said first and second pluralities are substantially coincident; and
   comparing the modulated output from said fourth plurality from the modulated output from said second plurality to effectuate a signal having low side lobes.

9. The apparatus as in claim 3, wherein the transmissive sections of the third and fourth tracks comprise a plurality of nonuniformly spaced slits.

* * * * *